United States Patent
Scharf

(10) Patent No.: US 10,666,456 B2
(45) Date of Patent: May 26, 2020

(54) ARRANGEMENT WITH AT LEAST TWO BUS SUBSCRIBERS

(71) Applicant: SIEMENS AKTIENGESELLSCHAFT, Munich (DE)

(72) Inventor: Alexander Scharf, Kandel (DE)

(73) Assignee: Siemens Aktiengesellschaft, Munich (DE)

( * ) Notice: Subject to any disclaimer, the term of this patent is extended or adjusted under 35 U.S.C. 154(b) by 455 days.

(21) Appl. No.: 15/499,220

(22) Filed: Apr. 27, 2017

(65) Prior Publication Data

US 2017/0317847 A1    Nov. 2, 2017

(30) Foreign Application Priority Data

Apr. 28, 2016 (EP) .................................. 16167507

(51) Int. Cl.
   *H04L 12/403* (2006.01)
   *H04L 12/40* (2006.01)
   (Continued)

(52) U.S. Cl.
   CPC ............ *H04L 12/403* (2013.01); *G05B 15/02* (2013.01); *H03K 19/018557* (2013.01);
   (Continued)

(58) Field of Classification Search
   CPC ..................................................... H04L 12/403
   See application file for complete search history.

(56) References Cited

U.S. PATENT DOCUMENTS

| 7,145,378 B2 | 12/2006 | Rowe et al. |
| 2006/0282549 A1* | 12/2006 | Vinnemann ........... H04L 12/403 710/3 |
| 2010/0306562 A1 | 12/2010 | Chen |

FOREIGN PATENT DOCUMENTS

| CN | 201797293 U | 4/2011 |
| CN | 102522982 | 6/2012 |

(Continued)

OTHER PUBLICATIONS

Office Action dated Sep. 3, 2019 issued in Chinese Patent Application No. 20170273712.4.

(Continued)

*Primary Examiner* — Daniel J Cavallari
(74) *Attorney, Agent, or Firm* — Cozen O'Connor

(57) ABSTRACT

An arrangement that includes a bus subscriber with two power supply terminals, at least one bus line terminal and a bus interface circuit for controlling a data flow via the at least one bus line terminal, wherein a controllable switch is located between the bus interface circuit and the at least one bus line terminal and the bus subscriber contains a sensor circuit which records the voltage between the power supply terminals or a voltage derived therefrom and closes the controllable switch if the recorded voltage exceeds a threshold value and opens the same if the recorded voltage fails to reach the threshold value, where with an arrangement including at least two bus subscribers, these bus subscribers are connected with their bus line terminals to a bus having at least one bus line and with their power supply terminals via two current lines to a shared voltage source.

7 Claims, 2 Drawing Sheets

(51) Int. Cl.
*H03K 19/0185* (2006.01)
*G05B 15/02* (2006.01)
*H01L 27/02* (2006.01)

(52) U.S. Cl.
CPC .. *H04L 12/40039* (2013.01); *H04L 12/40045* (2013.01); *H01L 27/0255* (2013.01)

(56) References Cited

FOREIGN PATENT DOCUMENTS

| | | |
|---|---|---|
| CN | 102780204 A | 11/2012 |
| CN | 102957142 | 3/2013 |
| DE | 19926095 A1 | 12/2000 |
| EP | 1612689 B1 | 1/2006 |
| WO | WO 2010/108580 | 9/2010 |
| WO | WO 2016/041730 | 3/2016 |

OTHER PUBLICATIONS

Siemens Technical Data; Siemens Technical Data; General Description; EIB-TP-UART-IC; pp. 1-27; p. 2; 2010.

* cited by examiner

ARRANGEMENT WITH AT LEAST TWO BUS SUBSCRIBERS

BACKGROUND OF THE INVENTION

1. Field of the Invention

The invention relates to an arrangement with at least two bus subscribers, a voltage source shared therebetween and connected to two current lines as well as a bus having at least one bus line, wherein each of the bus subscribers has two power supply terminals for connection to the two current lines, at least one bus line terminal for connection to the bus and a bus interface circuit for controlling a data traffic via the bus.

2. Description of the Related Art

EP 1 612 689 B1 discloses a conventional arrangement that has at least two bus subscribers.

Bus subscribers are understood to mean devices which, e.g., within the scope of the automation of a technical plant, fulfill certain functions and for this purpose exchange data with one another or with a higher-order facility, such as a control facility, via a bus. To supply power to the bus subscribers, these can be energized from a shared voltage source via two current lines. The bus subscribers thus have two power supply terminals, with which they are connected in parallel to the two current lines. The bus can consist of one or a number of bus lines. In the case of only one bus line, one of the current lines forms the return line. For connection to the bus, the bus subscribers have a number of bus line terminals that correspond to the number of bus lines. The power supply and bus line terminals may be terminal plugs or contacts of a plug-in connector, for instance. Each bus subscriber contains a bus interface circuit (bus driver), which controls the data traffic via the bus.

Various bus systems are known. Therefore the widely used standard RS-485 provides for an asynchronous serial data transmission on two bus lines, for instance, where an inverted level is transmitted on the one bus line and a non-inverted level of a 1-bit data signal is transmitted on other bus line and, on the receiver side, the original data signal is reconstructed from the difference of the two voltage levels.

If a bus subscriber is connected to the power supply and the bus or is separated from these, i.e., when a bus subscriber formed as a module is plugged in or disconnected, for instance, this generally means that the electrical connections between the individual terminals of the bus subscriber and the associated bus and current lines are not established or interrupted simultaneously. This may result in a cross current on the bus, if the bus subscriber attempts to establish or maintain a one-sided power supply that is not yet established or interrupted via a bus connection that already exists or still exists. Even though such a critical state is only very short, such a cross current may be sufficient to destroy the bus interface circuits and if applicable existing protective circuits. Although it is possible to electrically isolate the bus interface circuits from the other components in the bus subscribers, this is however associated with a comparatively high component outlay and moreover negatively affects the transmission of data.

U.S. Pat. No. 7,145,378 B2 discloses a configurable bus switch formed from a group of individual switches for switching and separating bus lines. Here, a control logic decodes a five-digit enable signal into individual switching signals for the twenty individual switches. A circuit with a programmable diode permits a voltage level displacement to be performed on the switches as a function of a control signal.

US 2010/0306562 A1 discloses a DC-DC converter as an integral part of a power supply of a computer. In order for the DC-DC converter to not enter an unwanted state upon transition of the computer from a normal state into a resting state, a sensor circuit monitors the operating voltage and, by closing a MOSFET switch, connects a disable input of the DC-DC converter with ground if the recorded voltage fails to reach a threshold value. The sensor circuit contains a voltage divider and a transistor, where the voltage to be recorded is present on the voltage divider, and the transistor with its base emitter path is located on a branch of the voltage divider and controls the switch via its collector.

CN 102780204 A discloses a low voltage protective circuit with a MOSFET switch, which separates a load from a power supply if its voltage drops to below a threshold value. The MOSFET switch is controlled by a sensor circuit recording the voltage, where the sensor circuit likewise contains a voltage divider and a transistor, and where the voltage to be recorded is present on the voltage divider, and the transistor with its base emitter path is located on a branch of the voltage divider and controls the switch via its collector.

DE 199 26 095 A1 discloses an interface for coupling a bus subscriber to the bus line of a bus system, in particular to the bus system EIB. With this bus system, the voltage supply and data transmission are implemented on one and the same conductor pair. With an increased current requirement of the bus subscriber, this can be energized from an external power supply, wherein the interface, by way of which the bus subscriber is connected to the EIB, is supplied from the EIB. The interface generates a control signal for the bus subscriber, with which this is only then activated for the receipt and transmission of data if, on the one hand, the supply voltage of the bus subscriber and, on the other hand the bus voltage are also sufficient or have reached predetermined values.

SUMMARY OF THE INVENTION

It is an object of the present invention to protect bus subscribers provided for connection to a shared power supply from unwanted cross currents on the bus in a simple manner.

This and other objects and advantages are achieved in accordance with the invention by an arrangement in which, a controllable switch is located in each of the bus subscribers between its bus interface circuit and its at least one bus line terminal, and in which the bus subscriber contains a sensor circuit that is configured to record the voltage between its power supply terminals or a voltage derived therefrom and to close the controllable switch if the recorded voltage exceeds a threshold value, and configured to open the controllable switch if the recorded voltage fails to reach the threshold value to prevent a cross current via the bus if, in the case of one of the bus subscribers, only one of its power supply terminals is connected to the assigned current line. Here, derived voltage is understood to mean an electrical voltage, which is generated in the bus subscriber by voltage division or by voltage conversion from the voltage between the power-supply terminals for instance.

With the bus subscriber in accordance with the invention, the connection between the bus interface circuit and the bus is only then established if an operating voltage level of the bus subscriber, i.e., the voltage level during regular operation, is reached. The connection is interrupted if the operating voltage level is not reached. The operating voltage need not necessarily involve the feeding voltage, which the bus subscriber receives via the power supply lines. The bus subscriber can therefore contain a DC-DC converter, which converts the feeding voltage into one or a number of stable output voltages for supplying the bus interface circuit and/or further internal components. In this case, the sensor circuit can record one of these output voltages and verify whether the threshold value has been exceeded or not reached.

With two or more bus line terminals, a separate sensor circuit can be provided for each of the two or more controllable switches, or all controllable switches can be actuated jointly by a sensor circuit. Provision can also be made for the circuit part of the sensor circuit, which records the voltage immediately, only to be present once, while each switch is actuated by an individually assigned circuit part. In individual cases, it is decisive here that an adequate electrical potential separation between the bus lines is ensured by the configuration of the sensor circuit or the components used.

In accordance with an advantageous embodiment of the bus subscriber, the desired protection is achieved with minimal effort in that the sensor circuit contains a voltage divider and a transistor, where the voltage to be recorded is present on the voltage divider, and the transistor with its base emitter path is located on a branch of the voltage divider and controls the switch via its collector. The controllable switch preferably consists of a MOSFET. The threshold value of the sensor circuit is formed by the base-emitter threshold voltage of the transistor. The type of transistor and MOSFET are selected with respect to the polarity of the monitored voltage such that the transistor and MOSFET block when the voltage value is zero, i.e., in a current-less state.

With two or more bus line terminals and accordingly two or more controllable switches or MOSFETs, all controllable switches can be controlled jointly by a transistor. Provision can also be made for the voltage divider only to be present once, whereas a separate transistor is provided for each MOSFET.

Aside from the bus subscriber in accordance with disclosed embodiments, an arrangement with at least two such bus subscribers is also the subject matter of the invention, where the bus subscribers with their bus line terminals are connected to a bus having at least one bus line and with their power supply terminals are connected via two current lines to a shared voltage source.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

To further explain the invention, reference is made below to the figures in the drawings, which each show in detail in a schematic representation, in which.

DETAILED DESCRIPTION OF THE EXEMPLARY EMBODIMENTS

Figure 1:
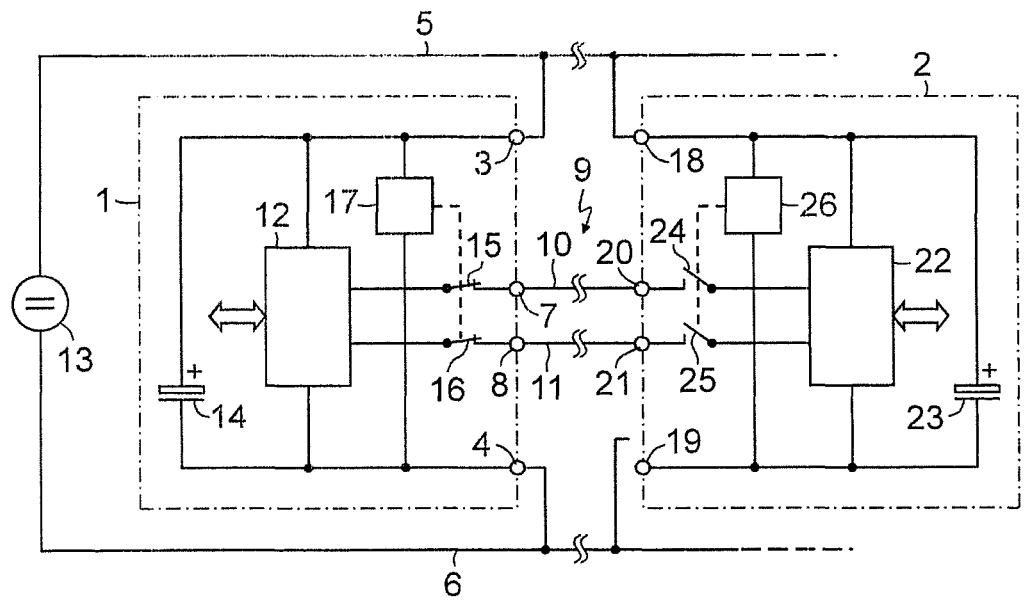
FIG. 1 is an exemplary embodiment of an arrangement with two bus subscribers in accordance with the invention.

In the different figures, the same reference characters have the same meaning.

FIG. 1 shows an arrangement with two bus subscribers 1, 2, which are of the same configuration and of which only components relevant to the invention are shown.

The bus subscriber 1 has two power supply terminals 3, 4 for connection to two power supply lines 5, 6, two bus line terminals 7, 8 for connection to a bus 9 with two bus lines 10, 11, and a bus interface circuit 12 that controls the data flow via the bus 9. The power supply terminals 3, 4 and bus line terminals 7, 8 may be terminal plugs or contacts of a plug-in connector, for instance. Each bus subscriber contains a bus interface circuit (bus driver), which controls the data traffic via the bus. The bus subscriber 1 is supplied with the energy it requires from a voltage source 13 via the two power supply lines 5, 6. Here, a capacitive buffer 14 serves to buffer the supplied energy, in order to cover a rapid increase in power requirement from the bus subscriber 1. The bus interface circuit 12 is not directly connected to the bus line terminals 7, 8 but, instead, via controllable switches 15, 16. The switches 15, 16 are controlled by a sensor circuit 17, which records the voltage between the power supply terminals 3, 4 and closes the controllable switches 15, 16 if the recorded voltage exceeds a threshold value and opens the controllable switches 15, 16 if the recorded voltage fails to reach the threshold value.

The other bus subscriber 2 is configured in exactly the same way as the bus subscriber 1 and has two power supply terminals 18, 19 for connection to the power supply lines 5, 6, two bus line terminals 20, 21 for connection to the bus 9, a bus interface circuit 22, a capacitive buffer 23, two controllable switches 24, 25 between the bus line terminals 20, 21 and the bus interface circuit 22, and a sensor circuit 26.

The two bus subscribers 1, 2 are to be energized jointly from the voltage source 13 and communicate with one another over the bus 9. It should be understood the bus subscriber 1 is already connected to the power supply lines 5, 6 and the bus lines 10, 11 via its terminals 3, 4, 7, 8. The capacitive buffer 14 is charged to the voltage of the voltage source 13. If the other bus subscriber 2 is now likewise to be connected to the power supply via the bus, then it may occur that the connection between one of the power supply lines, here e.g. 5, and the associated power supply terminal 18 as well as the connection between one or both bus lines 10, 11 and the associated bus line terminals 20, 21 is already established whereas the connection between the power supply line 6 and the associated power supply terminal 19 is still open. The capacitive buffer 23 is still not charged. Consequently, the power supply terminal 19 is almost at the same electrical potential as the power supply terminal 18. The voltage source 13 and/or the bus subscriber 1 therefore attempt, as a replacement for the missing connection between the power supply terminals 4 and 19, to establish a current path from the current line 5 via the bus interface circuit 22, the bus 9 and the bus interface circuit 12, to the current line 6, where with a correspondingly high voltage of the voltage source 13, the resulting cross current on the bus 9 can destroy the two bus interface circuits 12, 22. Such a cross current is prevented in that the sensor circuit 26 determines that the voltage, recorded thereby, between the power supply terminals 18 and 19, fails to reach the predetermined threshold value and as a result keeps the switches 24 and 25 open. The switches 24 and 25 are only closed when the connection between the power supply line 6 and the associated power supply terminal 19 is established and the capacitive buffer 23 is charged to such an extent that the voltage between the power supply terminals 18 and 19 exceeds the predetermined threshold value.

Figure 2:
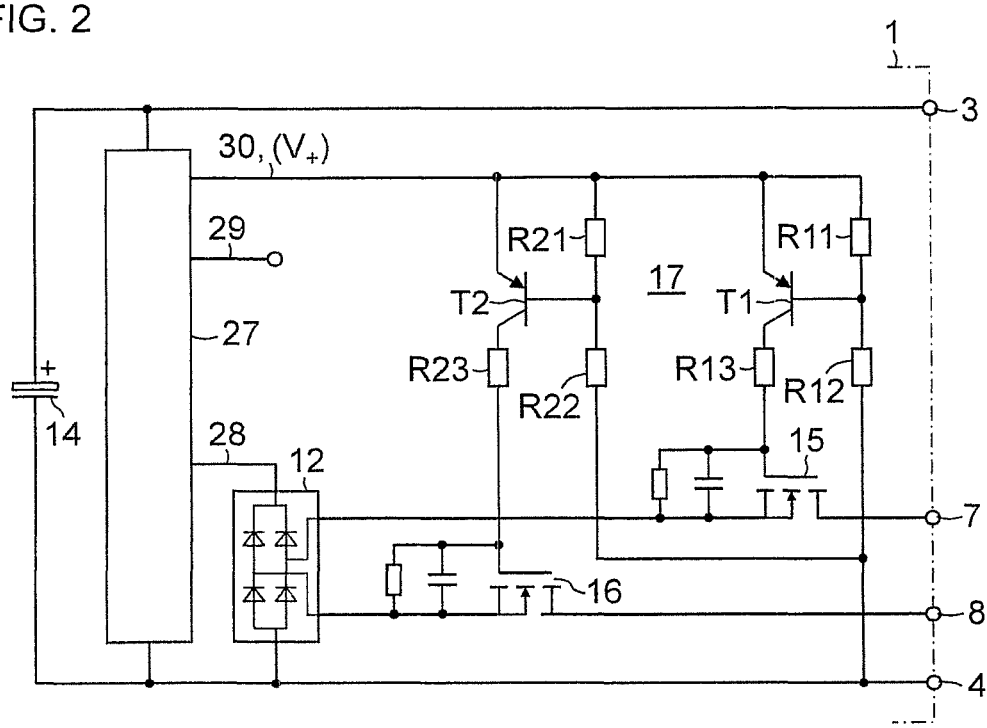
FIGS. 2 and 3 show two additional detailed exemplary embodiments of one of the bus subscribers.

FIG. 2 shows a more detailed representation of a modified exemplary embodiment of the bus subscriber 1 with the power supply terminals 3, 4, the bus line terminals 7, 8, the bus interface circuit 12, the capacitive buffer 14, the controllable switches 15, 16 and the sensor circuit 17. Contrary to the example of FIG. 1, the bus subscriber 1 contains a DC-DC converter 27, which at outputs 28, 29, 30 provides different voltages for supplying the bus interface circuit 12 and if applicable further components (not shown here). The sensor circuit 17 monitors the voltage V+ generated by the DC-DC converter 27 at its output 30 and is duplicated for the two controllable switches 15, 16 formed as n-channel MOSFETs. For each of the two switches 15, 16, the sensor circuit 17 contains a voltage divider formed in each case from resistors R11, R12 or R21, R22, where the voltage divider is present between the output 30 of the DC-DC converter 27 and the power supply terminal 4 serving as ground. A pnp transistor T1, T2 with its base emitter path is located on the branch of the voltage divider formed by the resistor R11 or R21 and controls the respective MOSFET switch 15 or 16 via its collector and a series resistor R13, R23. The threshold value of the sensor circuit 17 is determined by the base emitter threshold voltage of the transistors T1, T2 and the voltage divider ratio. If, e.g., the voltage $V_+\cdot(R11/(R11+R12))$ is thus smaller than the base emitter threshold voltage of the transistor T1, then the transistor T1 and the MOSFET switch 15 are nonconductive, i.e., the switch 15 is opened. The same applies to switch 16.

With the bus interface circuit 12, an internal protective circuit with protective diodes is shown. Here, the problem described in conjunction with FIG. 1 appears clearly again in that, e.g., with a closed switch 15, a cross current driven by the potential on the power supply line 5 and coming from the bus 9 can flow via the bus line terminal 7, the switch 15, the bus interface circuit 12, and the output 28 of the DC-DC converter 27 to the ground (power-supply terminal 4).

Figure 3:
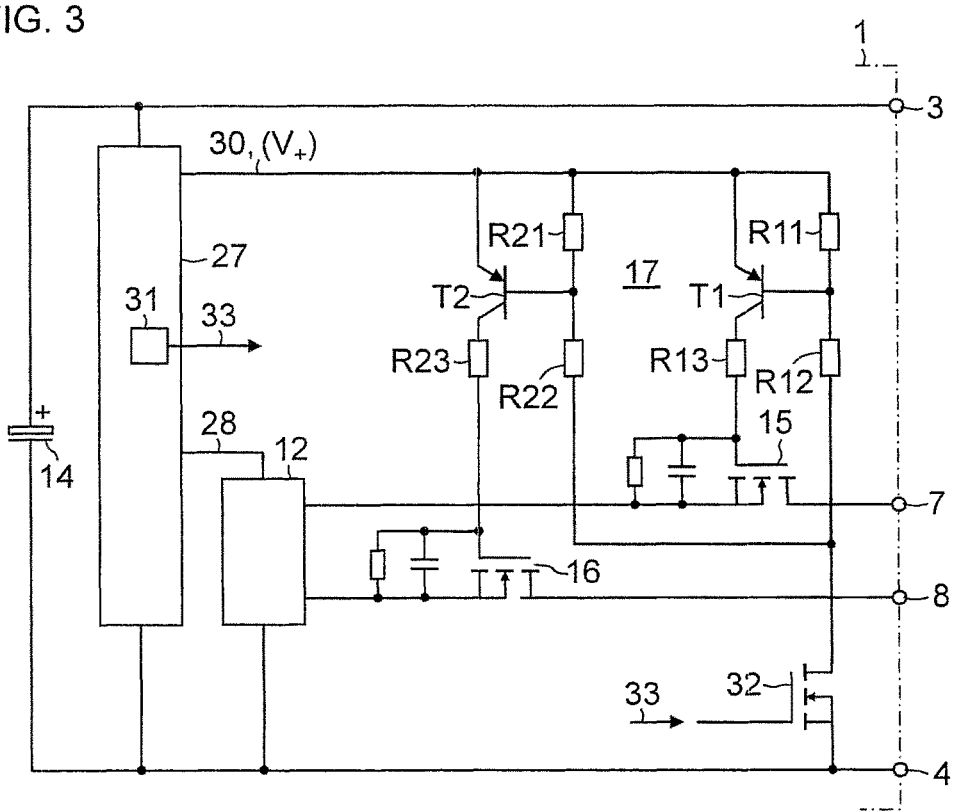

The exemplary embodiment of the inventive bus subscriber 1 shown in FIG. 3 differs from that of FIG. 2 in that a circuit 31 present in the bus subscriber 1, here in the DC-DC converter 27, is used to identify a low voltage in order to control the switches 15, 16. To this end, the voltage dividers R11, R12 and R21, R22 are not connected directly to the power supply terminal 4 but, instead, via a further MOSFET switch 32. With a normal operating voltage, the circuit 31 generates a control voltage 33, which controls the MOSFET switch 32 in a conducting state. With a low voltage or voltage drop, this control voltage 33 drops out so that the MOSFET switch 32 and consequently the transistors T1, T2 and the MOSFET switches 15, 16 each pass into the blocking state.

Figure 4:
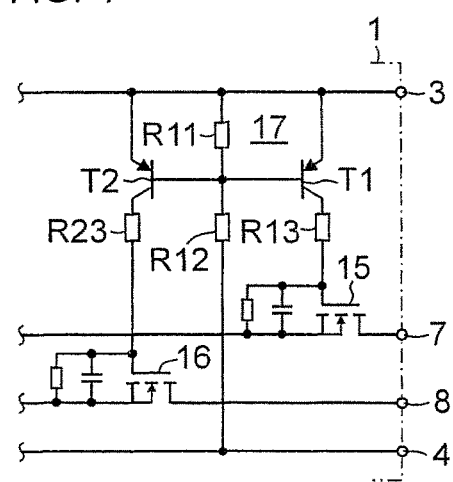
FIGS. 4 and 5 show different modifications of the exemplary embodiment of FIG. 2.

As FIG. 4 shows, the two voltage dividers shown in FIGS. 2 and 3 can be replaced by a single voltage divider R11, R12, where the transistors T1, T2 with their base emitter paths are located jointly on the branch of the voltage divider formed by the resistor R11 and control the MOSFET switches 15, 16 via their collectors and the series resistors R13, R23.

Figure 5:
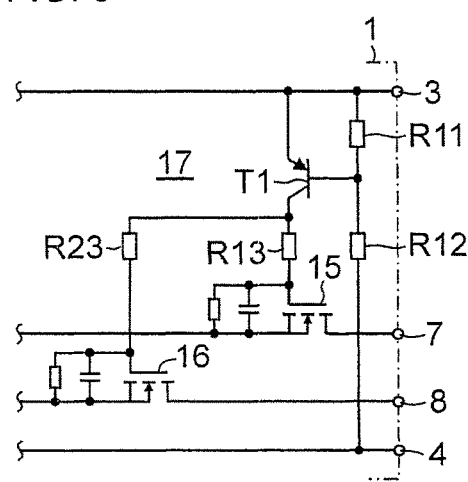

In the exemplary embodiment shown in FIG. 5, the transistor T2 is omitted and the transistor T1 simultaneously controls both MOSFET switches 15, 16 via its collector and the series resistors R13, R23.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An arrangement comprising:
    a plurality of bus subscribers;
    a voltage source shared between the plurality of bus subscribers and connected to two current lines and a bus having at least one bus line, each bus subscriber of the plurality of bus subscribers having two power supply terminals for connection to the two current lines, at least one bus line terminal for connection to the bus and a bus interface circuit for controlling a data traffic via the bus; and
    a controllable switch located in each of the plurality of bus subscribers between its bus interface circuit and its at least one bus line terminal, each bus subscriber of the plurality of bus subscriber containing a sensor circuit which records one of (i) a voltage between its power supply terminals and (ii) a voltage derived therefrom, said sensor circuit closing the controllable switch when the recorded voltage exceeds a threshold value and opening the controllable switch when the recorded voltage fails to reach the threshold value to prevent a cross current via the bus when, with one bus subscriber of the plurality of bus subscribers, only one power supply terminal of the two power supply terminals is connected with an assigned current line.

2. The arrangement as claimed in claim 1, wherein each bus subscriber of the plurality of bus subscribers contains a DC-DC converter to supply power to its bus interface circuit from a voltage obtained via the power supply lines and wherein its sensor circuit records an output voltage of the DC-DC converter.

3. The arrangement as claimed in claim 1, wherein the sensor circuit contains a voltage divider and a transistor, wherein a voltage to be recorded is present on the voltage divider, the transistor with its base emitter path is located on a branch of the voltage divider and controls the switch via its collector.

4. The arrangement as claimed in claim 2, wherein the sensor circuit contains a voltage divider and a transistor, wherein a voltage to be recorded is present on the voltage divider, the transistor with its base emitter path is located on a branch of the voltage divider and controls the switch via its collector.

5. The arrangement as claimed in claim 3, wherein the controllable switch comprises a MOSFET.

6. The arrangement as claimed in claim 4, wherein the voltage to be recorded via a further controllable switch is present on the voltage divider and the bus subscriber contains a circuit for identifying low voltage which, in cases of a low voltage, separates the voltage divider from the voltage to be recorded.

7. The arrangement as claimed in claim 6, wherein the further controllable switch comprises a MOSFET.

* * * * *